(12) United States Patent
Becker et al.

(10) Patent No.: US 7,337,422 B1
(45) Date of Patent: Feb. 26, 2008

(54) PROGRAMMABLY CONFIGURABLE LOGIC-BASED MACRO

(75) Inventors: Tobias J. Becker, Bergisch Gladbach (DE); Adam P. Donlin, Los Gatos, CA (US); Brandon J. Blodget, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 261 days.

(21) Appl. No.: 11/126,130

(22) Filed: May 10, 2005

(51) Int. Cl.
   *G06F 17/50* (2006.01)
(52) U.S. Cl. .............................. 716/16; 716/17; 716/18
(58) Field of Classification Search .................... 716/6, 716/11, 16–18; 326/38–41
   See application file for complete search history.

(56) References Cited

U.S. PATENT DOCUMENTS

| | | | |
|---|---|---|---|
| 5,914,616 | A | 6/1999 | Young et al. |
| 6,879,184 | B1 * | 4/2005 | Fisk ............................. 326/41 |
| 6,891,395 | B2 * | 5/2005 | Wells et al. ................... 326/38 |
| 7,124,391 | B1 * | 10/2006 | Patterson ...................... 716/17 |
| 2002/0010853 | A1 * | 1/2002 | Trimberger et al. ............ 713/1 |
| 2002/0157071 | A1 * | 10/2002 | Schiefele et al. ............... 716/6 |
| 2005/0132316 | A1 * | 6/2005 | Suaris et al. ................... 716/11 |

OTHER PUBLICATIONS

XILINX, Inc.; "Virtex-II Pro Platform FPGA Handbook"; published Oct. 14, 2002; pp. 19-71, available from Xilinx, Inc., 2100 Logic Drive, San Jose, California 95124.

XILINX, Inc.; "Virtex-II Platform FPGA Handbook"; published Dec. 2000; pp. 33-75, available from Xilinx, Inc., 2100 Logic Drive, San Jose, California 95124.

XILINX, Inc.; "The Programmable Logic Data Book"; published Apr. 2000; pp. 3-75 TO 3-96, available from Xilinx, Inc., 2100 Logic Drive, San Jose, California 95124.

XILINX, Inc., "Two Flows for Partial Reconfiguration: Module Based or Difference Based"; XAPP290 (1.2); Sep. 9, 2004, available from Xilinx, Inc., 2100 Logic Drive, San Jose, California, 95124; May 17, 2002; pp. 1-29.

Huebner, Michael, et al., "Real-Time LUT-Based Network Topologies for Dynamic and Partial FPGA Self-Reconfiguration", Sep. 7-11, 2004, pp. 28-32, available from http://www.itiv.uni-karlsruhe.de/.

Sedcole, Pete et al., "Modular Partial Reconfiguration in Virtex FPGAs" pp. 211-216, Aug. 24-26, 2005 available from Xilinx, Inc., 2100 Logic Drive, San Jose, CA 95124.

* cited by examiner

*Primary Examiner*—Paul Dinh
(74) *Attorney, Agent, or Firm*—W. Eric Webostad

(57) ABSTRACT

A programmably configurable logic-based macro is described. Portions of configuration logic blocks for interconnectivity are assigned. The portions are configured as respective shift registers. Interconnects are routed between design static locations associated to provide interconnectivity between the portions. The portions assigned and routed are saved as a macro file. Inputs and outputs of the macro file are defined in a hardware description language. The hardware description language definition of the inputs and the outputs of the macro file are synthesized to provide a bitstream for programming programmably configurable logic associated with the portions. A shift register-to-shift register module interface boundary is created within an array of the programmably configurable logic.

15 Claims, 11 Drawing Sheets

PROGRAMMABLY CONFIGURABLE LOGIC-BASED MACRO

FIELD OF THE INVENTION

One or more aspects of the invention relate generally to integrated circuitry and, more particularly, to a programmably configurable logic-based macro.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex™ FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines."

Another such FPGA, the Xilinx Virtex™-II FPGA, is described in detail in pages 33-75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

In a CLB, there may be one or more units of programmably configurable circuitry known as "slices." These slices may be in each CLB in an array of CLBs which may make up part of programmably configurable circuit of an FPGA, or what is known as "FPGA fabric."

Accordingly, it would be desirable and useful to provide means to facilitate modular circuitry design instantiated in an array of CLBs.

SUMMARY OF THE INVENTION

One or more aspects of the invention generally relate to integrated circuitry and, more particularly, to a programmably configurable logic-based macro.

An aspect of the invention is a method for creating a module boundary interface within an array of programmably configurable logic. Portions of configuration logic blocks for interconnectivity are assigned. The portions are configured as respective shift registers. Interconnects are routed between design static locations associated to provide interconnectivity between the portions. The portions assigned and routed are saved as a macro file. Inputs and outputs of the macro file are defined in a hardware description language. The hardware description language definitions of the inputs and the outputs of the macro file are synthesized to provide a bitstream for programming programmably configurable logic associated with the portions.

Another aspect of the invention is an interface for initializing a module instantiated in programmably configurable logic. Portions of configuration logic blocks of the programmably configurable logic are coupled for interconnectivity responsive to a macro. The portions are coupled to provide unidirectional data flow to the module. One of the portions is external to the module. Another of the portions is internal to the module. The module is part of a design instantiated in the programmably configurable logic. The interconnectivity is provided with at least one interconnect routed between static locations associated with the design. The at least one interconnect associated with initialization signaling is provided from the one of the portions to the other of the portions. The other of the portions is configured to provide the initialization signaling as a global initialization signal with respect to only the module.

Yet another aspect of the invention is an interface for partial reconfiguration of a module instantiated in programmably configurable logic. Portions of configuration logic blocks of the programmably configurable logic are coupled for interconnectivity responsive to a macro. The portions are coupled to provide unidirectional data flow to the module. A first portion of the portions is external to the module. A second portion of the portions is internal to the module. The module is part of a design instantiated in the programmably configurable logic. The interconnectivity is provided with at least one interconnect routed between first static locations associated with the design. The first portion of the portions is configured to mask output from the second portion of the portions responsive to reconfiguration of the module. The reconfiguration of the module is at least part of partial reconfiguration of the design.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art that the invention may be practiced without all the specific details given below. In other instances, well-known features have not been described in detail so as not to obscure the invention. For ease of illustration, the same number labels are used in different diagrams to refer to the same items; however, in alternative embodiments the items may be different.

Figure 1:
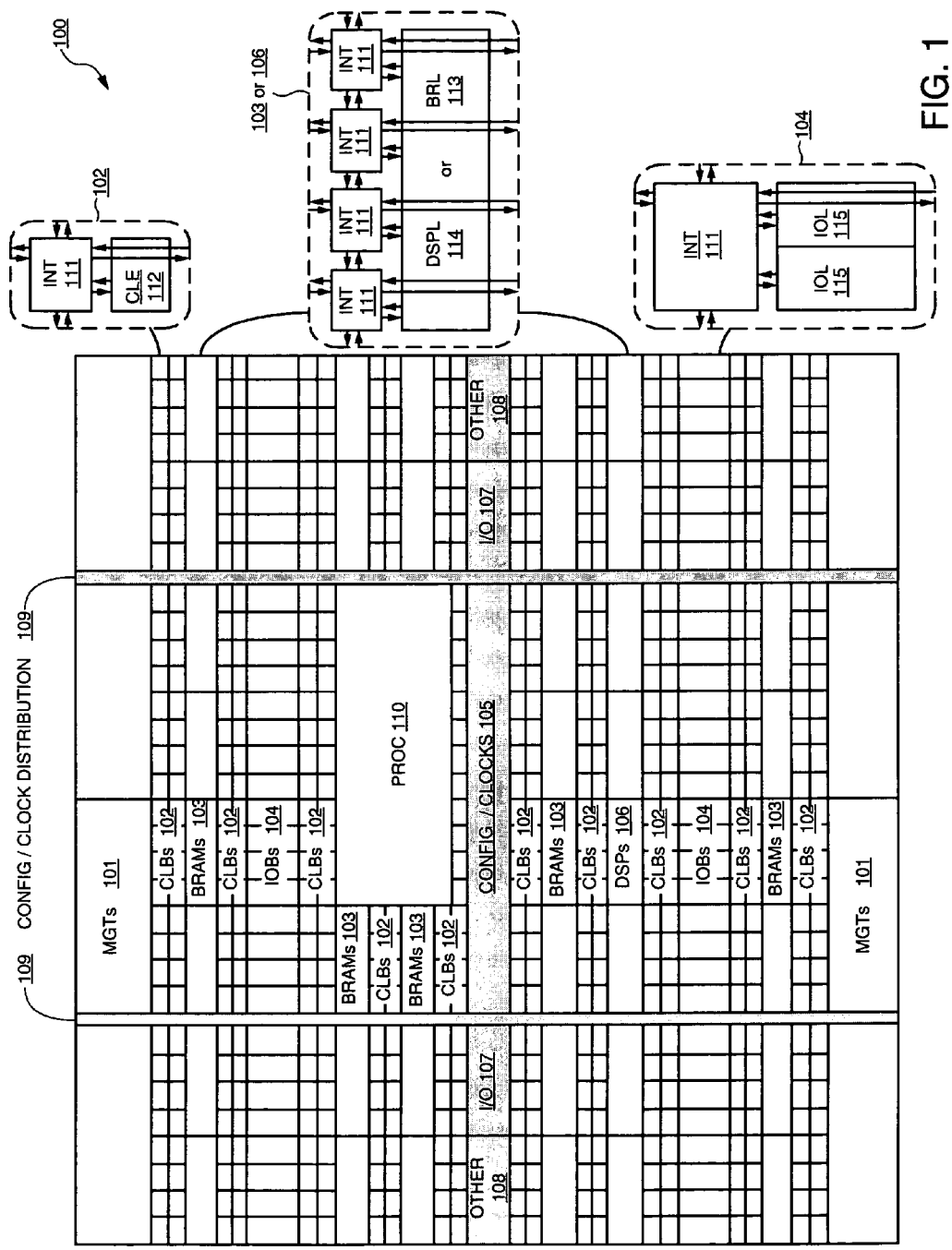
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1. In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 may include a configurable logic element ("CLE") 112 that may be programmed to implement user logic plus a single programmable interconnect element 111. A BRAM 103 may include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element ("DSPL") 114 in addition to an appropriate number of programmable interconnect elements 111. An IOB 104 may include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic.

FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2A:
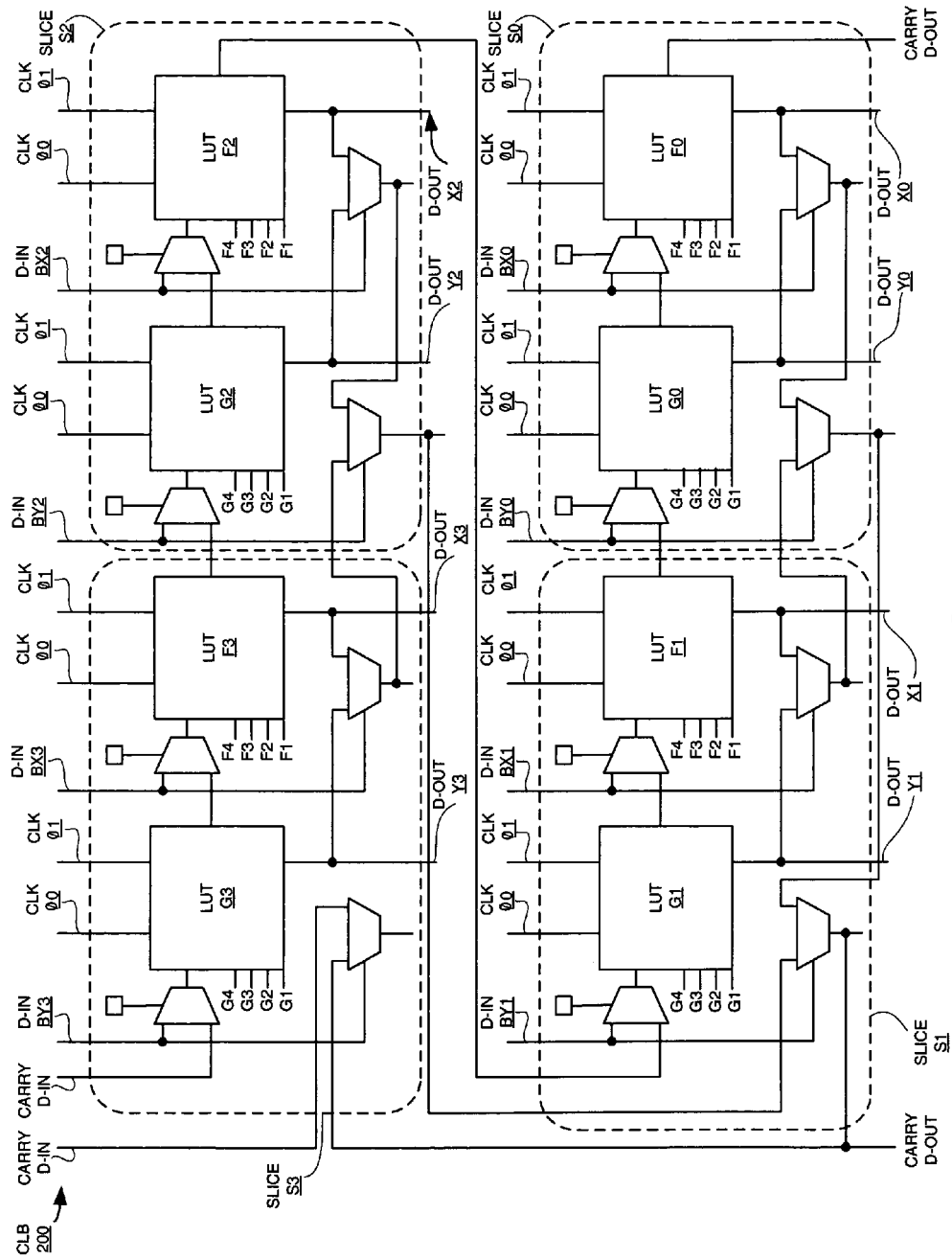
FIG. 2A is a block/schematic diagram depicting slices of an exemplary embodiment of a configurable logic block ("CLB").

FIG. 2A is a block/schematic diagram depicting slices S0 through S3 of an exemplary embodiment of a CLB 200. CLB 200 is merely one example of a slice architecture that may be used in FPGAs. Such FPGAs are available from Xilinx, Inc. of San Jose, Calif., among other FPGA vendors. As CLB 200 is well known, it is not described in unnecessary detail for purposes of clarity.

Figure 2B:
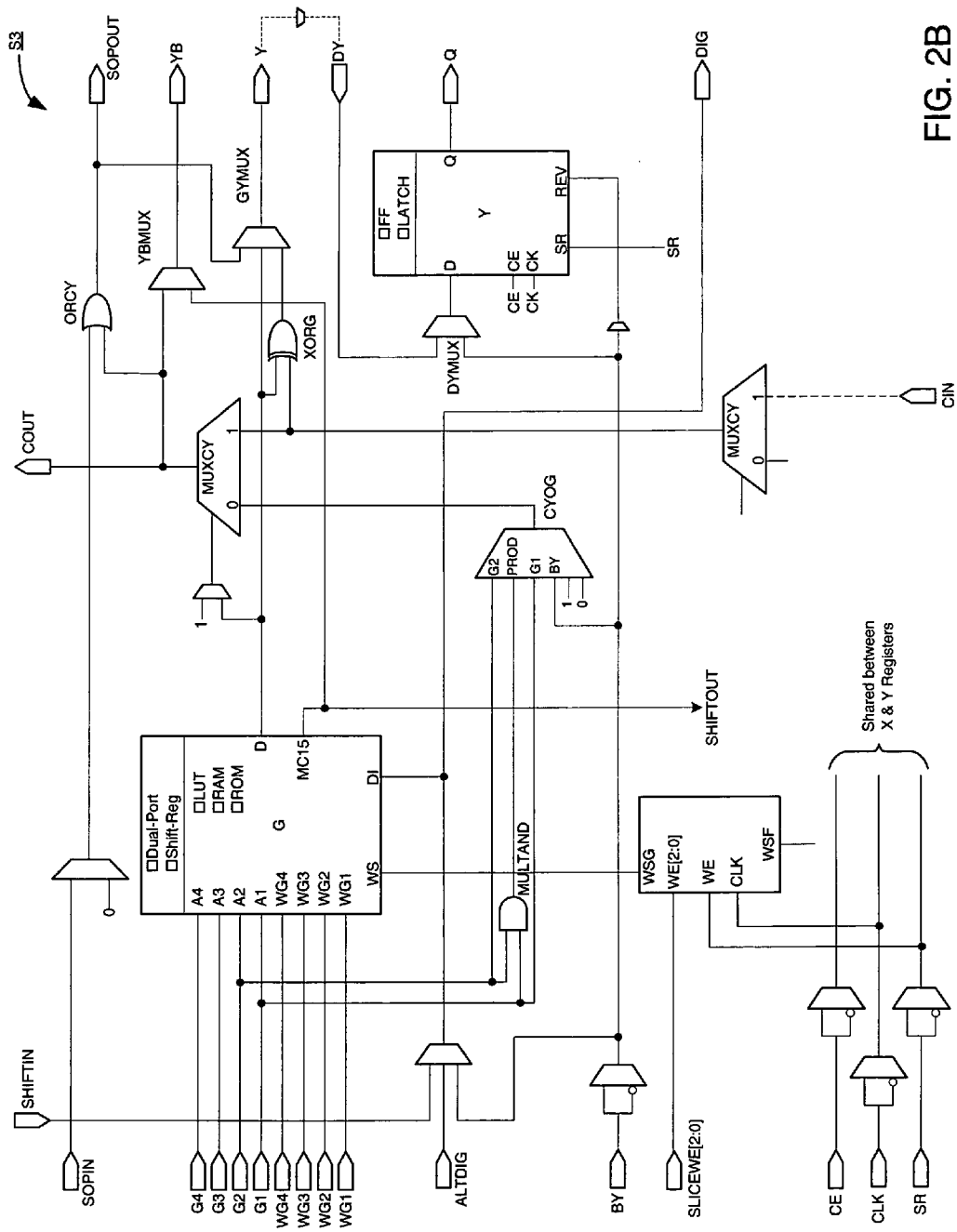
FIG. 2B is a block/schematic diagram depicting a left half of a slice of FIG. 2A.

FIG. 2B is a block/schematic diagram depicting a left half of slice S3 of FIG. 2A. Though a Virtex-II Pro™ slice, available from Xilinx, Inc. of San Jose, Calif., is depicted here for purposes of clarity by way of example, it will be readily appreciated that other slice architectures may be used within the scope of the disclosure presented. Notably, slice S3 may be configured as a shift register. Furthermore, output Y of slice S3 may be fed back as input data DY to a flip-flop via a DY multiplexer ("DYMUX"). As slice S3 is well known, it is not described in unnecessary detail herein for purposes of clarity.

Figure 3A:
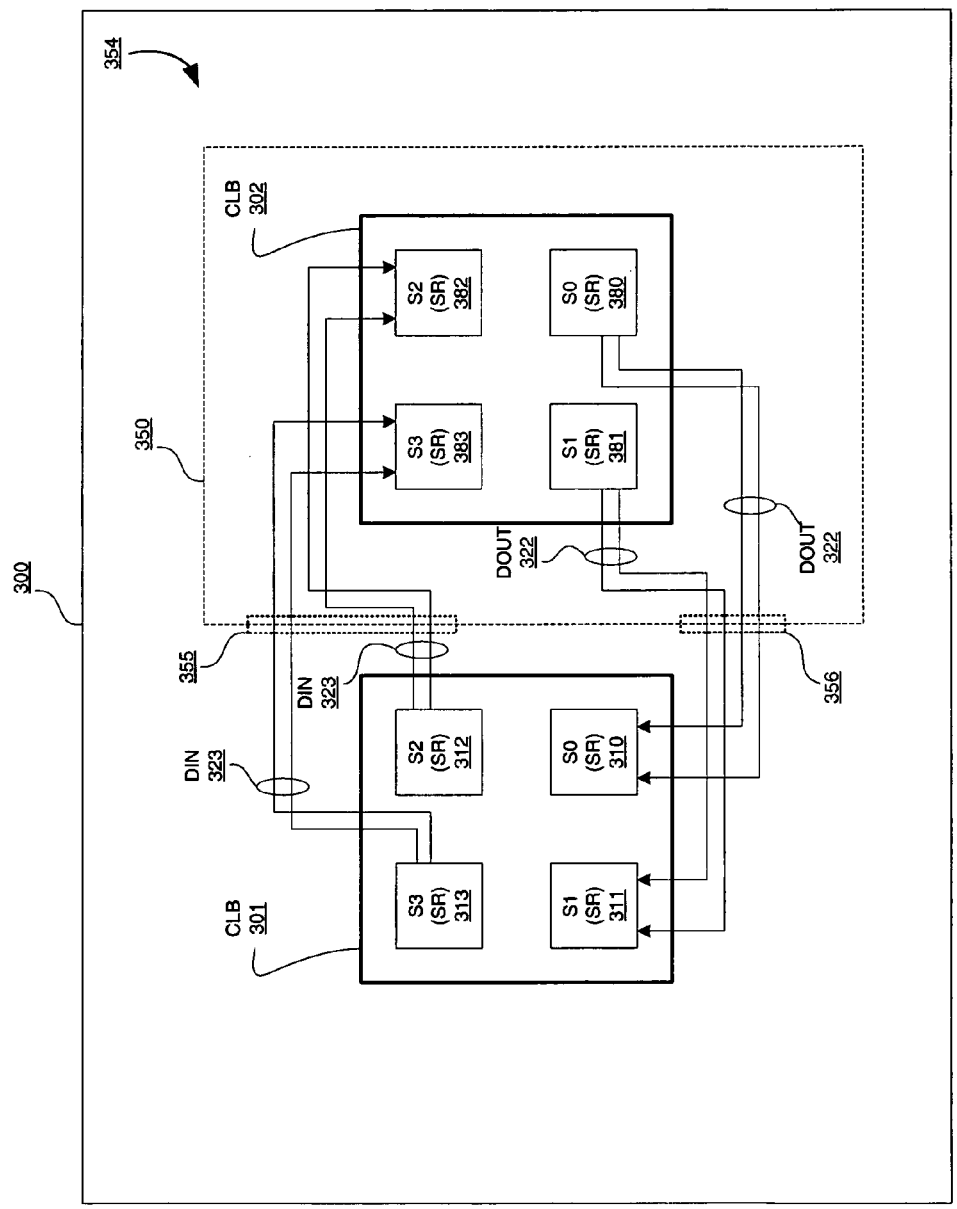
FIG. 3A is a high-level block diagram depicting an exemplary embodiment of programmably configurable logic having instantiated therein a slice-based macro.

FIG. 3A is a high-level block diagram depicting an exemplary embodiment of programmably configurable logic 300 having instantiated therein a slice-based macro 354. Programmably configurable logic 300 may be an array of CLBs, such as may be found in an FPGA 100 of FIG. 1. For purposes of clarity and by way of example, two CLBs, namely CLB 301 and CLB 302, are described, although it should be appreciated that more than these two CLBs may be part of programmably configurable logic 300 and may be implemented in accordance with the present disclosure. CLB 302 is located in a portion 350 of programmably configurable logic 300. Portion 350 is distinguished by a dashed box from the remainder of programmably configurable logic 300 to delineate it as a potential target for partial reconfiguration. As is known, in FPGAs, a portion of a design instantiated in programmably configurable logic 300 may be reconfigured, also known as partial reconfiguration, while operating the FPGA. Moreover, the instantiated design, aside from the portion being reconfigured, may continue to operate during partial reconfiguration thereof.

For partial reconfiguration, an instantiated design identifies static nodes within portion 350. These static nodes or locations are to identify points at which an instantiated design may be decoupled from the remainder of the instantiated design. These locations, by being static or other otherwise design invariant, remain as identified locations for reconfiguration. In other words, logic to be instantiated over or in place of existing logic in portion 350 uses the same interconnect points to couple the portion being reconfigured with the remainder of the instantiated design. Accordingly, there is a boundary, as generally indicated by the dashed box delineating portion 350 from the remainder of programmably configurable logic 300. It should be appreciated that portion 350 may be a module of an instantiated design at least partly located within programmably configurable logic 300, and thus the boundary between portion 350 and the remainder of an instantiated design may be referred to as a "module boundary." Coupling and decoupling portions of an instantiated design suitable for partial reconfiguration is facilitated by a slice-based macro. The slice-based macro, which may be a slice-based bus macro, may be included as part of the bitstream used to instantiate a design.

In the example of the slice-based macro 354 illustratively shown in FIG. 3A, pins of CLB 301 are designated for coupling to static locations identified as part of an instantiated design, which in this example, employs CLB 302 as at least part of an interface to the remainder of the instantiated design. In other words, a CLB slice-to-CLB slice boundary interface between partially reconfigurable logic and the remainder of an instantiated design is created using a slice-based macro 354.

More particularly, in this implementation, each CLB 301 and 302 includes four slices. In this example, slice S3 313 of CLB 301 is coupled to provide data to slice S3 383 of CLB 302, and slice S2 312 of CLB 301 is coupled to provide data to slice S2 382 of CLB 302. Furthermore, slice S0 380 of CLB 302 is coupled to slice S0 310 of CLB 301 for providing data thereto, and slice S1 381 of CLB 302 is coupled to slice S1 311 of CLB 301 for providing data thereto. It should be understood that, in general, data may be provided in only one direction from a slice to another slice. Moreover, slice association may be maintained, such that a slice in one CLB only communicates with another similarly positioned slice within another CLB; for example, a slice S2 in one CLB only communicates with another slice S2 in another CLB. Data input to portion 350 may be via a data input bus, as particularly identified as data input bus 323 from CLB 301 to CLB 302, and data output from portion 350 may be via a data output bus 322 from CLB 302 to CLB 301. Hence, this macro may be thought of as a slice-based bus macro 354.

With continuing reference to FIG. 3A and renewed reference to FIGS. 2A and 2B, slice-based macro 354 of FIG. 3A is further described, where portion 350 is considered a module 350 of a design. Accordingly, a boundary between module 350 and another module of a design may be a slice-based bus macro 354 generated boundary with CLBs on either side of the interface. In this configuration, X and Y data outputs of a slice may be respectively coupled to F and G lookup table ("LUT") inputs. More particularly, a Y1 data output of slice S1 381 may be coupled to a G1 LUT input of slice S1 311 and an X1 data output of slice S1 381 may be coupled to an F1 LUT input of slice S1 311. Moreover, an X1 data output of slice S2 312 may be coupled to an F1 LUT input of slice S2 382, and a Y1 data output of slice S2 312 may be coupled to a G1 LUT input of slice S2 382. Notably, CLB 301 may be coupled to CLB 302 using local interconnects, sometimes referred to as local lines. These local lines may be used to form a data input bus 323 and a data output bus 322, as previously described. Moreover, a single input-to-output interconnect may be implemented for slice-to-slice interconnectivity, though pairs of interconnects are illustratively shown herein.

Notably, in FIG. 3A, data flow with respect to slices S2 and S3 is from left to right across the boundary, and data flow with respect to slices S0 and S1 is from right to left. In each instance, data flow is unidirectional, whether from CLB 301 to CLB 302, or vice versa, for slice-to-slice data communication. Identification of bus data flow direction may be done as part of the slice-based macro with respect to pin types for coupling pins. However, to avoid having to select and enable control for directionality of data flow, two separate slice-based macros may be used. For example, one of such slice-based macros may be used for creating data flow from CLB 301 to CLB 302, or more generally, all data flow into module 350, and another of the slice-based macros may be used for data flow from CLB 302 to CLB 301, or more generally, all data flow out of module 350. Slice-based macros, as described with reference to FIG. 3A, may be implemented using an existing configuration of FPGA slices. Implementation details, such as slice internal setup and routing, may depend on the FPGA device family. However, the slice-based macro structure may remain invariant from FPGA to FPGA from a user's perspective. This facilitates providing one slice-based macro across multiple FPGA platforms. Furthermore, it should be appreciated that local interconnects, such as for buses 322 and 323, may be used for providing communication across module boundaries.

It should be appreciated that each of slices S0 through S3 of CLBs 301 and 302 may be configured as a shift register, as generally indicated by a "(SR)" in each of slices S0 through S3 of each of CLBs 301 and 302. Thus, data may be shifted into module 350 and out of module 350 via CLBs 301 and 302. Configuring slices as shift registers facilitates increasing data density within area of a semiconductor die. Thus, a shift register-to-shift register module interface boundary may be provided, where such boundary generally has an input portion 355 and an output portion 356.

Figure 3B:
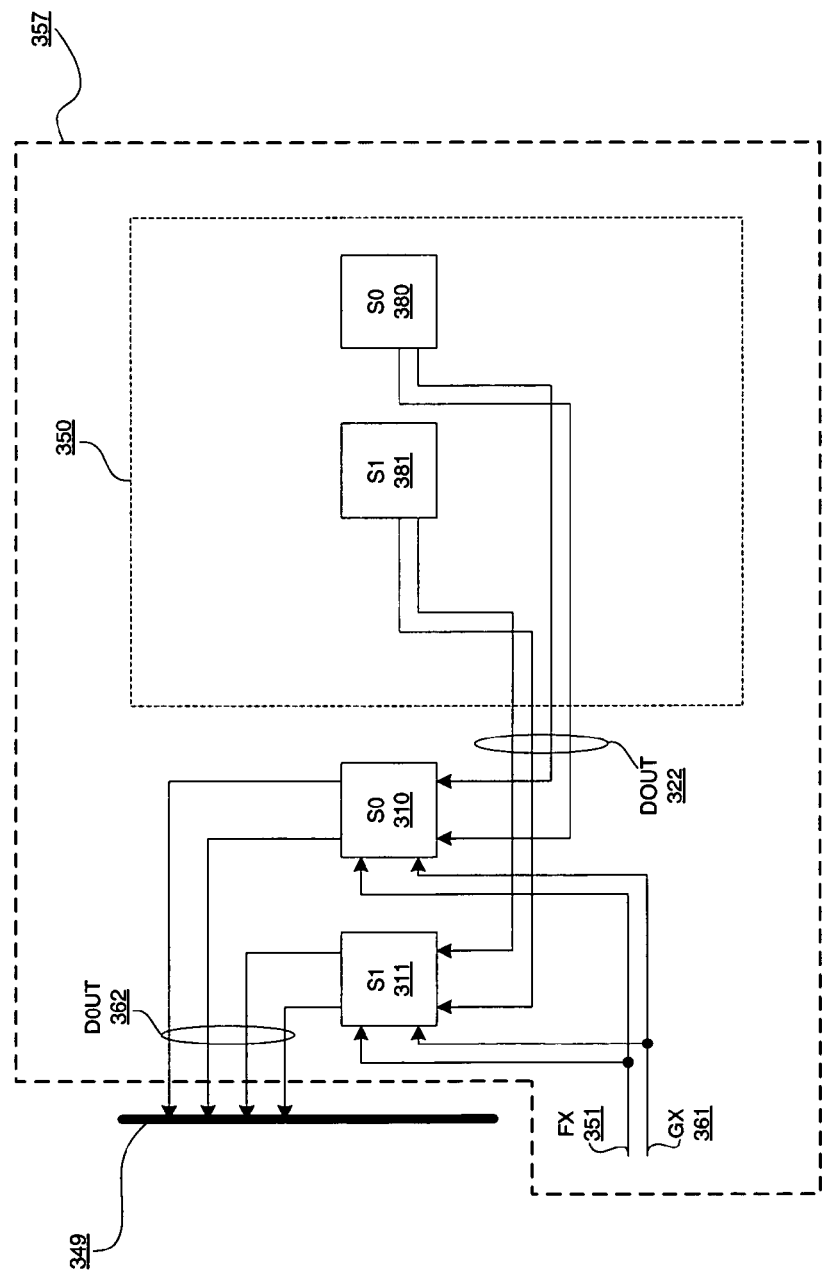
FIG. 3B is a block diagram depicting an exemplary embodiment of a slice-based macro having disable control.

FIG. 3B is a block diagram depicting an exemplary embodiment of a slice-based macro 357 having disable control. Notably, the slice-based macros of FIGS. 3B, 3C, and 3D have common elements to the slice-based macro of FIG. 3A, description of which is not repeated for purposes of clarity.

During partial reconfiguration, it may be desirable to disable output from module 350. For example, such output from module 350 may be coupled to a bus 349, where such bus 349 may be coupled to another circuit either dedicated or instantiated in an FPGA. To prevent corrupted data from reaching such other circuit, disable signals FX 351 and GX 361 may be respectively provided to F and G inputs of slices used as part of a slice-based macro.

With simultaneous reference to FIGS. 2A, 3A, and 3B, slices S1 311 and S0 310 may be coupled to receive disable signal FX 351 and disable signal GX 361 to respective ports of F and G LUTS of those slices. Disable signal FX 351 may be provided to an unused input port of LUT F1 of slice S1, such as input F2, and disable signal GX 361 may be provided to an unused input port of LUT G1 of slice S1, such as input G2. By asserting disable signals FX 351 and GX 361, output of slices S0 380 and S1 381 via S0 310 and S1 311, respectively, provided to bus 349 via data output bus 362, are set to a default logic level, such as a logic low level. In other words, by asserting disable signals FX 351 and GX 361, data output of slices S0 380 and S1 381 is put into a default logic low state overriding any other possible data output from those slices until such signals FX 351 and GX 361 are de-asserted. More particularly, output of slices S0 310 and S1 311 is put in this default state until partial reconfiguration of module 350 is complete and module 350 is in a state in which data may reliably be sent again. By providing a logic low level on all of such signals output from slices S0 and S1, an indication that data is not presently available is provided to bus 349. Thus, the opportunity of corrupt data being provided to bus 349 may be avoided for purposes of reconfiguring module 350. In other words, in a partial reconfiguration state, output via data output bus 322 from slices S0 380 and S1 381 respectively to slices S0 310 and S1 311 is masked, and only logic 0 appears on each signal line of data output bus 362 until the reconfiguration state is completed.

Notably, use of disable signals FX 351 and GX 361 may not be possible when slices are configured as shift registers. However, output of such shift registers may be provided to a flip-flop or latch of such slices. Accordingly, disable signals FX 351 and GX 361 may be provided to such flip-flop for providing a logic low output to bypass shift register output. For example, bypass signal BY in FIG. 2B may be a logic low input to a flip-flop via a DYMUX, and a disable signal may be used to select such logic low input as output from the flip-flop.

Figure 3C:
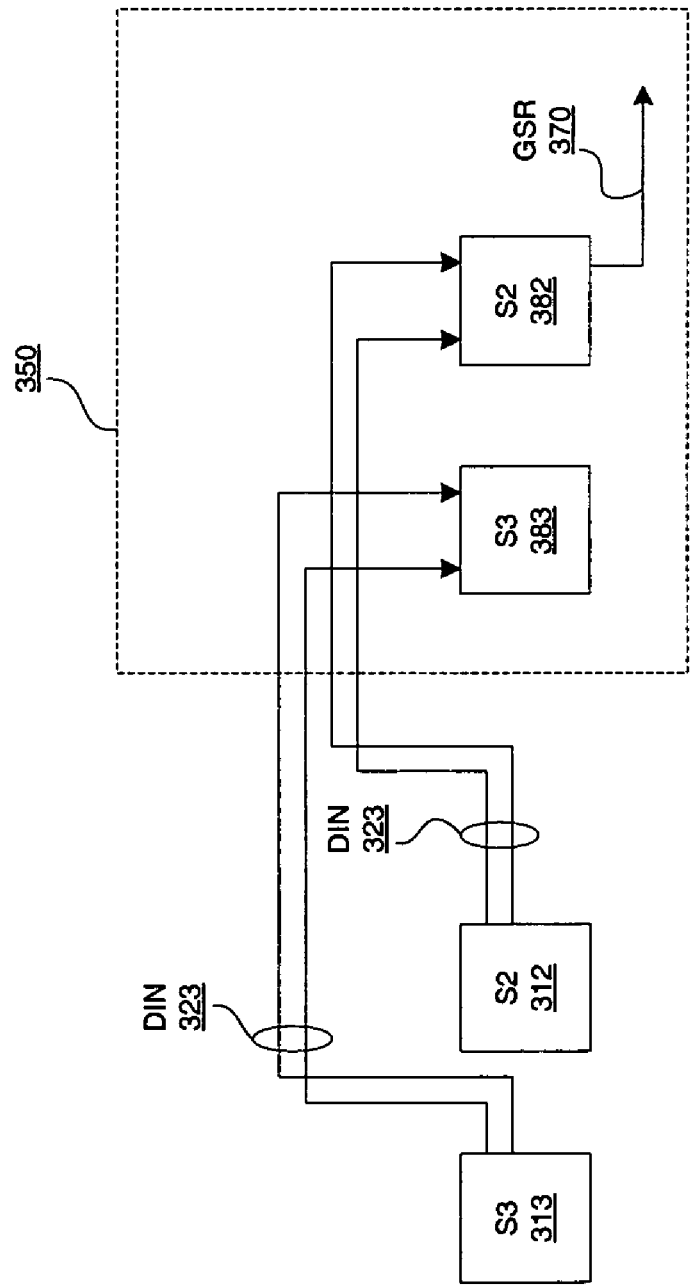
FIG. 3C is a block diagram depicting an exemplary embodiment of a slice-based macro having a module initialization.

FIG. 3C is a block diagram depicting an exemplary embodiment of a slice-based macro 358 having a module initialization, such as a set/reset. After a module 350 has been reconfigured during a partial reconfiguration operation, it may be desirable to initialize (e.g., set or reset) logic associated with such reconfiguration module 350 to a known state. Accordingly, it may not be desirable to initialize all logic instantiated in the design, but rather, it may be more desirable to limit such initialization to the reconfigured logic of module 350. Slice-based macro 358 may be used to facilitate this initialization of module 350. For example, suppose an X2 data output of slice S2 312 is coupled to an F2 input of LUT F2 of slice S2 382. This connection may be mapped as a set/reset ("S/R") signal route. More particularly, this S/R route may be identified as a global S/R route with respect to module 350. In other words, all instantiated logic in module 350 may be reset via assertion of a reset associated with assertion of an S/R signal from slice S2 312 to S2 382 along this route. Accordingly, output of slice S2 382 may be a S/R signal 370, which is employed as a global S/R ("GSR") signal 370 with respect to only module 350 of an instantiated design in programmably configurable logic. Thus, all logic of module 350 may be set or reset to a known state for subsequent operation thereof without necessarily resetting all instantiated logic.

Figure 3D:
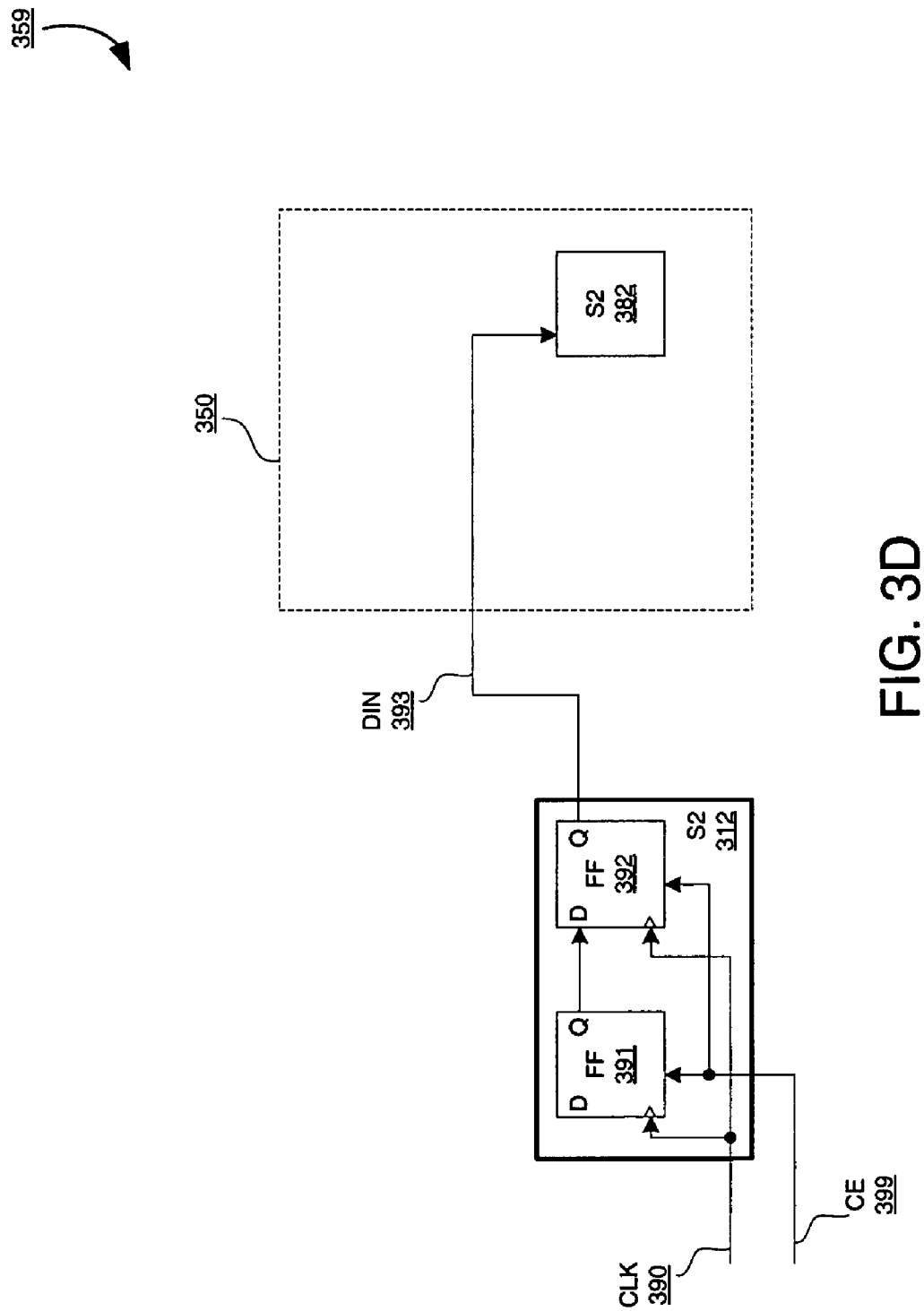
FIG. 3D is a block/schematic diagram depicting an exemplary embodiment of a slice-based macro having registered data input.

FIG. 3D is a block/schematic diagram depicting an exemplary embodiment of a slice-based macro 359 having registered data input. Notably, though data input to module 350 is described, it should be understood that data output from module 350 may be registered in like manner using the data output path. For purposes of clarity, the data input path is described to cover both the data input and the data output paths. For purposes of this example, slice S2 312 is shown having two flip-flops 391 and 392 coupled in series. Clock signal 390 is provided to clock each of flip-flops 391 and 392. Furthermore, a clock enable signal 399 is provided to clock enable/disable each of flip-flops 391 and 392. Notably, clock enable signal 399 may be optional, though with respect to partial reconfiguration of module 350, it may be useful to be able to enable/disable output from slice S2 312 via data input path 393 to slice S2 312 until slice S2 382 is ready to accept such data. Thus, a clock enable signal may effectively be used to mask clocked data to and from module 350 by inhibiting new data until reconfiguration is complete. Accordingly, it should be appreciated that a slice-based macro module boundary may be created where data may be registered, such as for pipelining, for input to module 350, for output from module 350, or for a combination thereof. Though it should be understood that the architecture described herein employs two flip-flops per slice, architectures having fewer or more flip-flops may be used. However, with respect to avoiding metastable states, the number of flip-flops used in series may be increased to enhance reliability. Thus, for example, multiple slices may be chained together to provide a chain of flip-flops to increase the number of flip-flops in the chain.

Figure 4A:
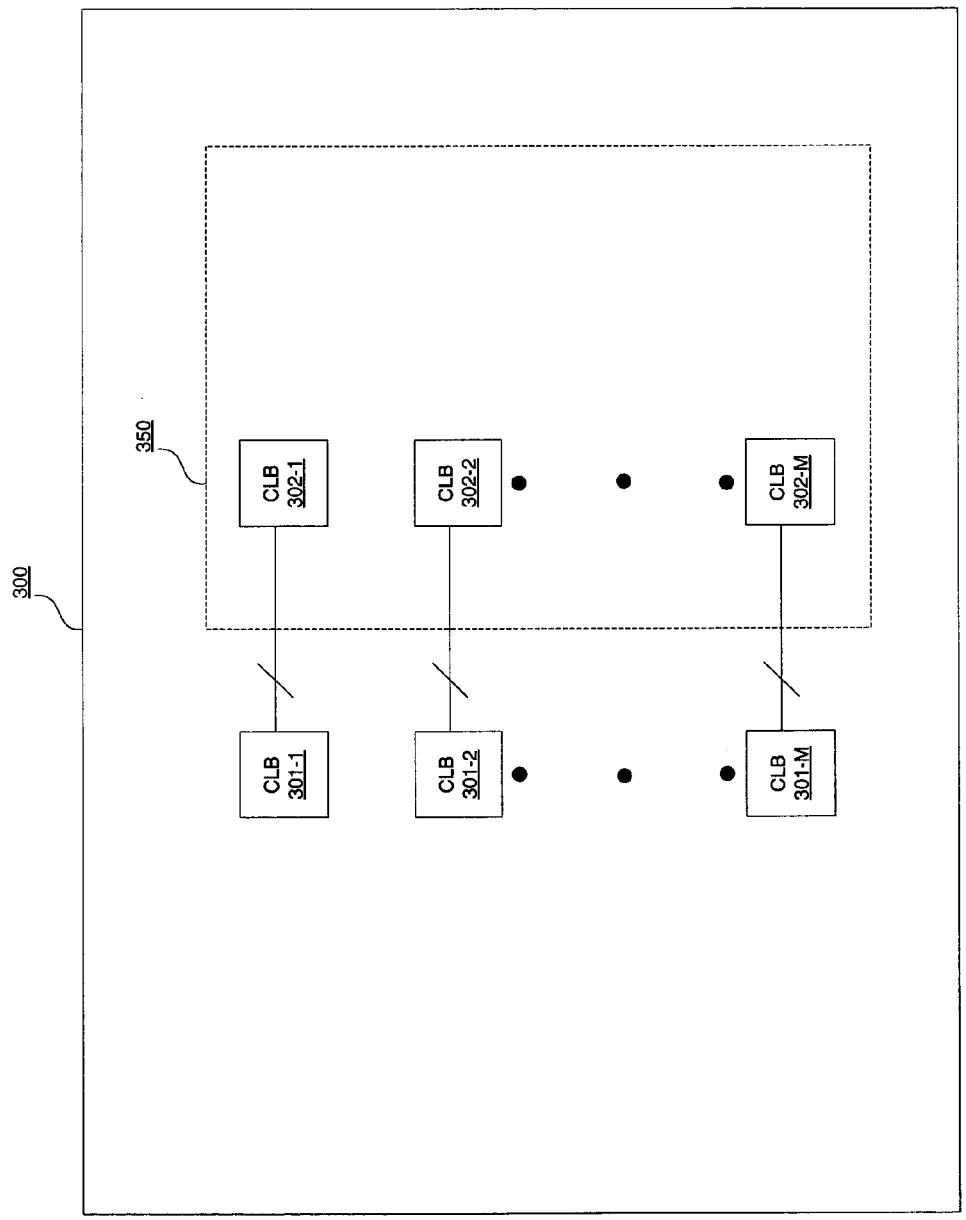
FIG. 4A is a high level block diagram depicting an exemplary embodiment of a CLB-to-CLB module boundary interface.

FIG. 4A is a high level block diagram depicting an exemplary embodiment of a CLB-to-CLB module boundary interface. In this example, there are M CLBs correspondingly coupled to M other CLBs, for M a positive integer greater than two. More particularly, CLBs 301-1 through 301-M external to module 350 are correspondingly coupled to CLBs 302-1 through 302-M internal to module 350. The coupling of CLBs 301-1 through 301-M correspondingly to CLBs 302-1 through 302-M provides a module boundary interface, which may be instantiated as described above with slice-to-slice coupling responsive to use of a slice-based macro.

Figure 4B:
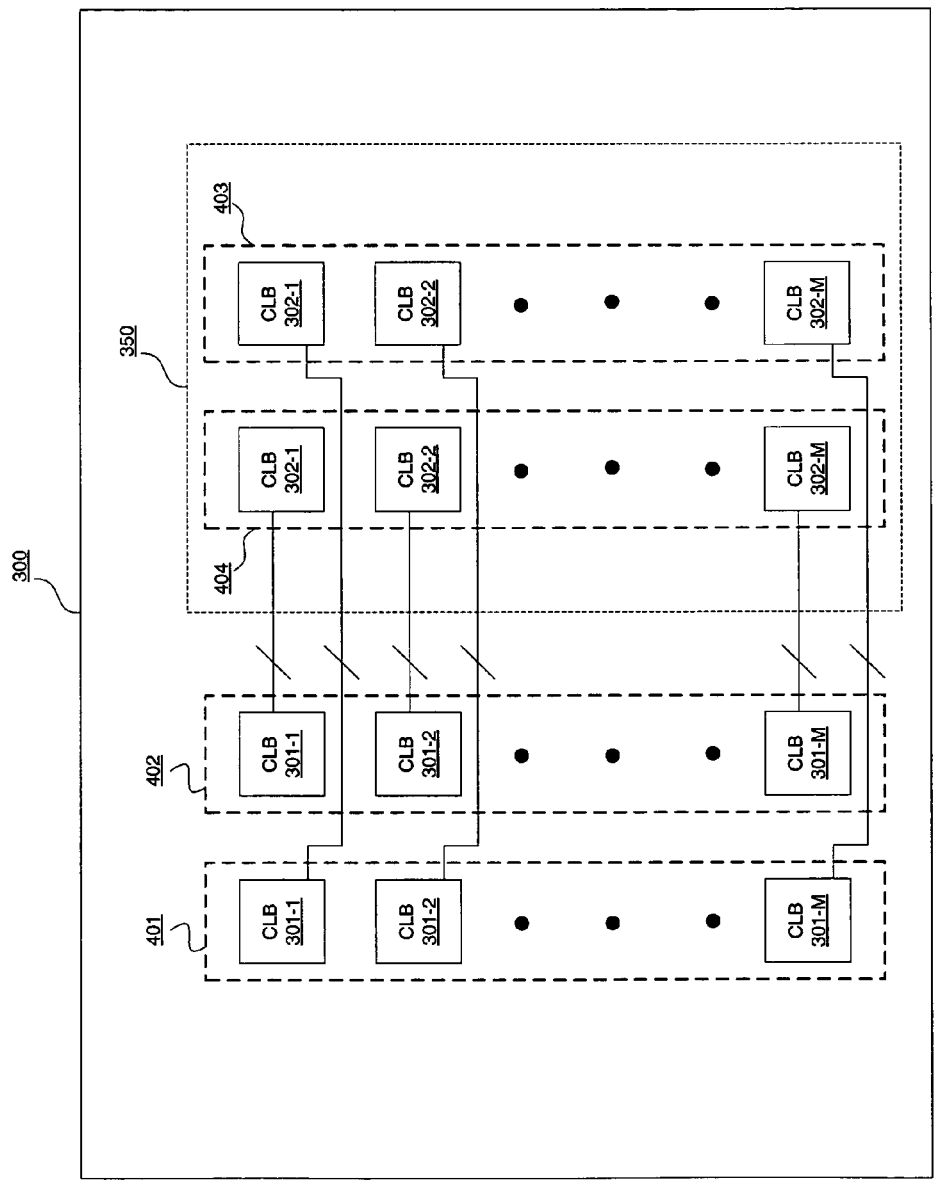
FIG. 4B is a high-level block diagram depicting an alternative embodiment to the module boundary interface of FIG. 4A.

It should be noted that the vertical number of CLBs in an array of CLBs of programmably configurable logic 300 may not provide sufficient bit width to provide a module boundary interface. Accordingly, adjacent CLBs may be used to increase module boundary interface bit width. For example, in the high-level block diagram of FIG. 4B, where there is shown an alternative embodiment to the module boundary interface of FIG. 4A, a second column of CLBs 301-1 through 301-M and a second column of CLBs 302-1 through 302-M are used. More particularly, all or a portion of CLBs of CLB column 402 are correspondingly coupled to CLBs of CLB column 404, and all or a portion of the CLBs of CLB column 401 are correspondingly coupled to CLBs of CLB column 403. This increases the row bit width density for providing a module boundary interface. Again, local interconnects may be used for correspondingly coupling CLBs of CLB columns 401 and 402 to CLBs of CLB columns 403 and 404, respectively. Furthermore, though not shown, CLBs of CLB column 401 may be correspondingly coupled to CLBs of CLB column 404 and CLBs of CLB column 402 may be correspondingly coupled to CLBs of CLB column 403 to provide more equivalent signal propagation delay using local interconnects spanning such couplings.

Figure 4C:
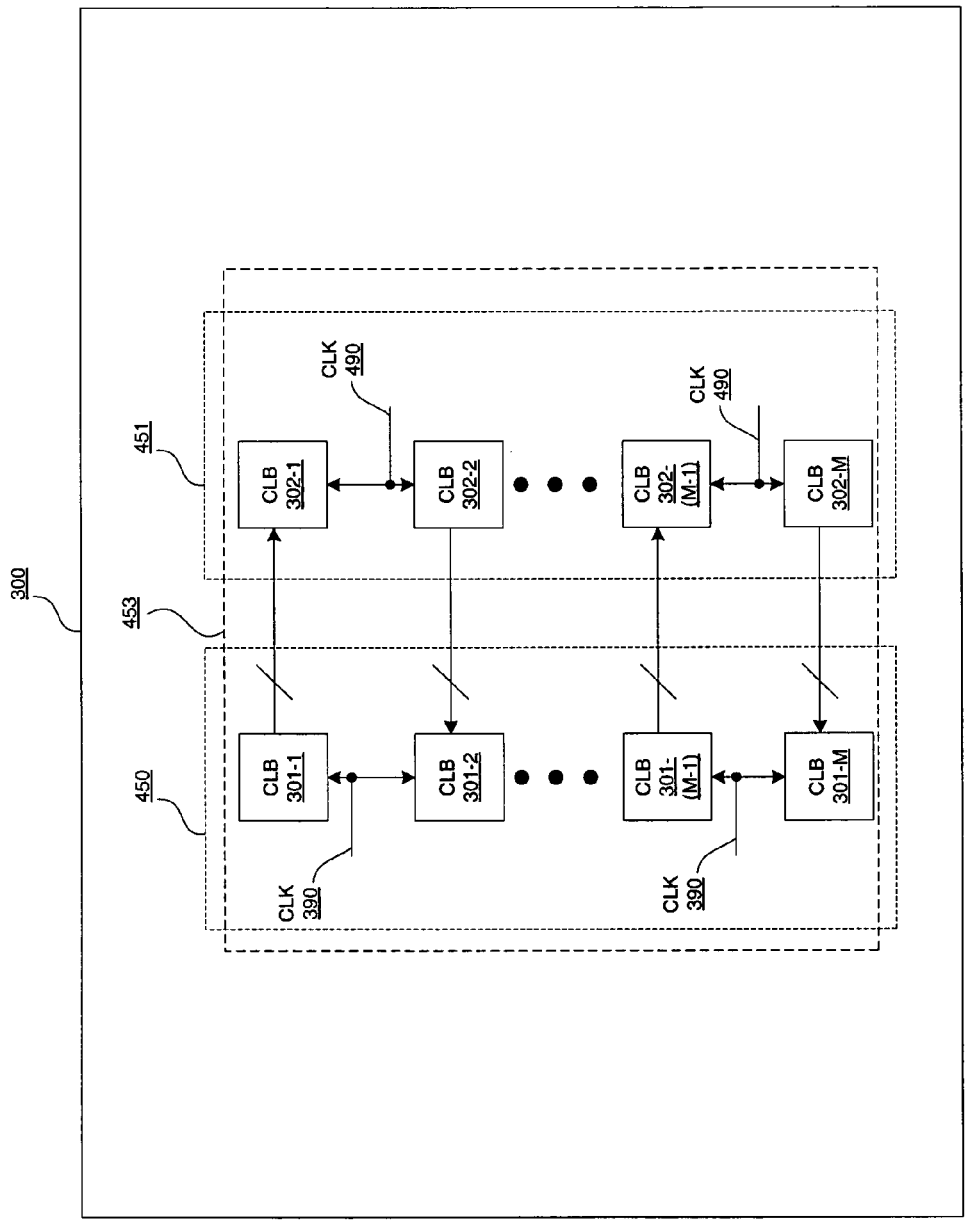
FIG. 4C is a high level block diagram depicting another exemplary embodiment of a CLB-to-CLB module boundary interface formed using a cross-clock domain slice-based macro.

FIG. 4C is a high level block diagram depicting another exemplary embodiment of a CLB-to-CLB module boundary interface formed using a cross-clock domain slice-based macro 453. In this embodiment, flip-flops of input CLBs, such as CLBs 301-1 through 301-M, are clocked responsive to clock signal 390, as previously described, and flip-flops of output CLBs, such as CLBs 302-1 through 302-M, are clocked responsive to clock signal 490. Notably, the prior description of clocking input flip-flops, applies to clocking output flip-flops and thus is not repeated.

Clock signals 390 and 490 may be in-phase or out-of-phase with respect to one another, may be the same or different frequencies, or may be any combination thereof. Thus, an input stage of slice-based macro 453 may be in a different clock domain than an output stage of slice-based macro 453. For example, an input stage associated CLB 301-1 is in a different clock domain than an output stage associated with CLB 302-1. Accordingly, modules, such as modules 450 and 451, on either side of a CLB-to-CLB module boundary interface created responsive to slice-based macro 453 may be clocked with independent clock domains from one another. Furthermore, slice-based macro 453 may be used for retiming of clock signals 390 and 490 with respect to one another. Notably, the number of flip-flops used may be adjusted to achieve a target metastability. The number of degrees of clock domain separation may be varied in accordance with the number of flip-flops used. Alternatively, rather than flip-flops as illustratively shown, other known asynchronous clock domain crossing circuitry may be used as one of skill in the art may appreciate. Examples of such other circuits include the use of first-in, first-out buffers ("FIFOs"), among other known circuits.

Moreover, as described above, CLBs may be configured as shift registers, and thus such shift registers may be used to delay signals, for example up to 16 clock cycles in the previously described example of a 16-bit shift register. For example, CLB 301-1 may be configured, at least in part, as a shift register clocked responsive to clock signal 390, and CLB 302-1 may be configured, at least in part, as a shift register clocked responsive to clock signal 490. Thus, shift registers may be used to delay communication of information across clock domains from module 450 to module 451, as well as from module 451 to module 450.

Figure 5:
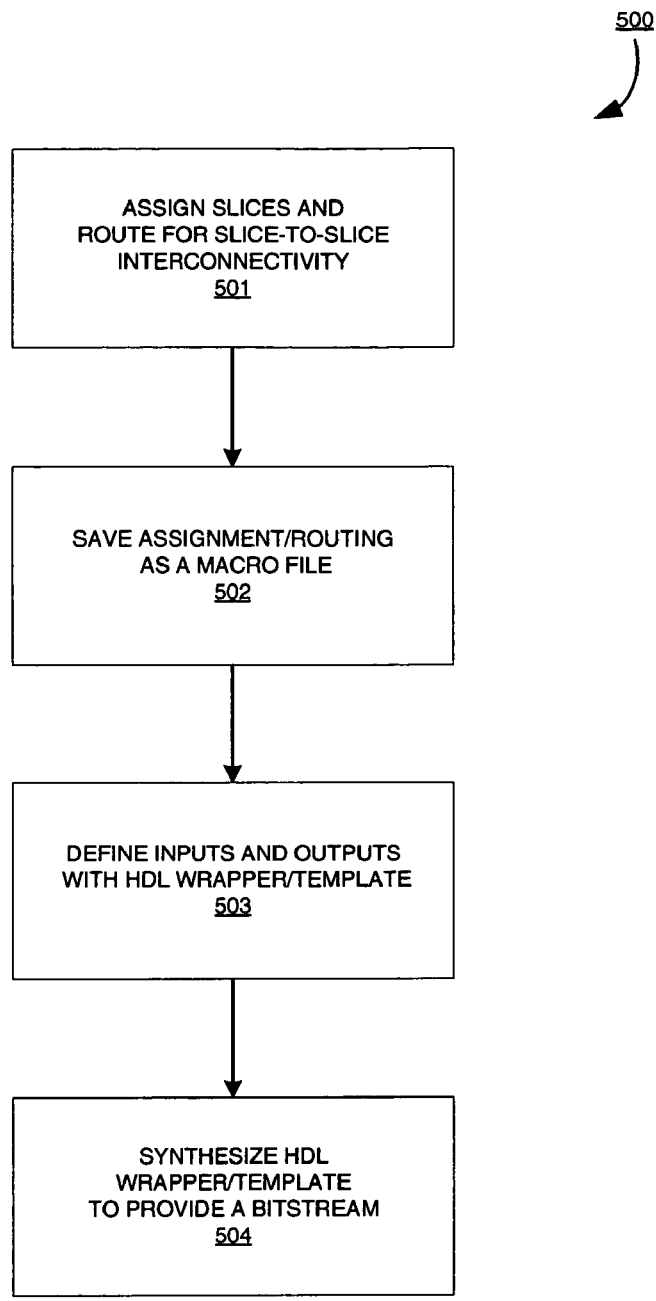
FIG. 5 is a flow diagram depicting an exemplary embodiment of a macro flow synthesis.

FIG. 5 is a flow diagram depicting an exemplary embodiment of a macro flow synthesis 500. At 501, slices for creating a slice-based macro module interface boundary are assigned. Additionally, input to output routing for slice-to-slice interconnectivity is done at 501. Again, routing is to and from static locations within a module and outside of a module. A software tool known as FPGA Editor, available from Xilinx, Inc. of San Jose, Calif., may be used for assignment and routing at 501.

At 502, the slices assigned, as well as their associated interconnect routing, is saved as a macro file. Using the FPGA Editor tool, this file is saved as a Native Macro Circuit ("NMC") description file. Alternatively, at 502, the assignment and routing done at 501 may be saved as a Native Circuit Description ("NCD") file using the FPGA Editor tool, which NCD file may be provided to a bitstream generator tool to generate a bitstream for programming an FPGA. However, as a macro may be used in multiple instances, the description that follows shall be for saving the file as a macro file.

At 503, inputs and outputs are defined for a hardware description language ("HDL"). These inputs and outputs of the macro created at 501 are put in an HDL wrapper or template. Examples of HDL include Verilog and Very High Speed Integrated Circuit ("VHSIC") HDL ("VHDL").

At 504, the HDL wrapper or template created at 503 may be synthesized using a known synthesis tool for synthesizing the HDL employed. Output of synthesis of the HDL wrapper or template is a bitstream which may be used to program an FPGA with a slice-based macro created at 501. The synthesis tool generally searches for the macro file, such as an NMC file, and automatically incorporates such macro file into a design to be instantiated. Notably, as the above description relates to a "hard" macro, even routing associated with instantiation of such a slice-based macro is fixed. Thus, even if a module is reconfigured, these interconnects created at 501 will be re-established along with the data flow direction.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, although an FPGA implementation is described, any integrated circuit having a sufficient number of programmably configurable resources for instantiating a modular design may be used. Claim(s) listing steps do not imply any order of the steps. Trademarks are the property of their respective owners.

What is claimed is:

1. An interface for initializing a module instantiated in programmably configurable logic, the interface comprising:

portions of configuration logic blocks of the programmably configurable logic coupled for interconnectivity responsive to a macro, the portions coupled to provide unidirectional data flow to the module, one of the portions being external to the module and another of the portions being internal to the module, the module being part of a design instantiated in the programmably configurable logic;

the interconnectivity provided with at least one interconnect routed between static locations associated with the design;

the design configured to identify the static locations to identify points at which the design is capable of being decoupled from a remainder of the design;

the static locations being invariant for purposes of partial reconfiguration of the design wherein same interconnect points are used to couple a part of the design being reconfigured with the remainder of the design;

the static locations defining a boundary between the one of the portions external to the module and the other of the portions internal to the module; and the at least one interconnect associated with initialization signaling provided from the one of the portions to the other of the portions, the other of the portions configured to provide the initialization signaling as a global initialization signal with respect to only the module.

2. The interface according to claim 1, wherein the portions are slices; and wherein the macro is a slice-based bus macro for defining the boundary for coupling the static locations.

3. The interface according to claim 2, wherein the at least one interconnect is a local interconnect of an array of the programmably configurable logic.

4. The interface according to claim 3, wherein the array of the programmably configurable logic is located in a programmable logic device.

5. The interface according to claim 4, wherein the programmable logic device is a field programmable gate array.

6. An interface for partial reconfiguration of a module instantiated in programmably configurable logic, the interface comprising:

portions of configuration logic blocks of the programmably configurable logic coupled for interconnectivity responsive to a macro, the portions coupled to provide unidirectional data flow to the module, a first portion of the portions being external to the module and a second portion of the portions being internal to the module, the module being part of a design instantiated in the programmably configurable logic; the interconnectivity provided with at least one interconnect routed between first static locations associated with the design;

the design configured to identify the static locations to identify points at which the design is capable of being decoupled from a remainder of the design;

the static locations being invariant for purposes of partial reconfiguration of the design wherein same interconnect points are used to couple a part of the design being reconfigured with the remainder of the design;

the static locations defining a boundary between the first portion of the portions and the second portion of the portions; and the first portion of the portions being configured to mask output from the second portion of the portions responsive to reconfiguration of the module, the reconfiguration of the module being at least part of the partial reconfiguration of the design.

7. The interface according to claim 6, wherein the first portion of the portions is coupled between the second portion and a bus, the first portion of the portions configured to provide a logic low level responsive to assertion of a disable signal associated with the reconfiguration of the module to mask output from the second portion from the bus; and wherein the macro is a slice-based bus macro for providing the bus and defining the boundary for coupling the static locations.

8. The interface according to claim 7, wherein the first portion of the portions includes a lookup table having an input port coupled to receive the disable signal.

9. The interface according to claim 6, further comprising a third portion of the portions coupled to a fourth portion of the portions, the third portion being external to the module, the fourth portion being internal to the module, the third portion coupled to the fourth portion via at least one other interconnect routed between second static locations associated with the design.

10. The interface according to claim 9, wherein the third portion includes at least one register coupled to provide registered data output from the third portion to the fourth portion.

11. The interface according to claim 10, wherein the portions are slices.

12. The interface according to claim 11, wherein the at least one interconnect and the at least one other interconnect are respective local interconnects of an array of the programmably configurable logic.

13. The interface according to claim 12, wherein the array of the programmably configurable logic is located in a programmable logic device.

14. The interface according to claim 6:

wherein the macro further instantiates in the programmably configurable logic a slice-based modular interface for cross-clock domain clocking;

wherein the first portion has a corresponding first clock domain;

wherein the second portion has a corresponding second clock domain;

the first clock domain different from the second clock domain;

each of the first portion and the second portion configured with at least one flip-flop;

the at least one flip-flop of the first portion clocked responsive to a first clock signal in the first clock domain; and the at least one flip-flop of the second portion clocked responsive to a second clock signal of the second clock domain.

15. The interface according to claim 14, wherein the slice-based modular interface is from the module to another module instantiated in the programmably configurable logic.

* * * * *